United States Patent
Martin et al.

(10) Patent No.: US 7,416,984 B2
(45) Date of Patent: Aug. 26, 2008

(54) METHOD OF PRODUCING A MEMS DEVICE

(75) Inventors: John R. Martin, Foxborough, MA (US); Manolo G. Mena, Quezon (PH); Elmer S. Lacsamana, Pampanga (PH); Maurice S. Karpman, Brookline, MA (US)

(73) Assignee: Analog Devices, Inc., Norwood, MA (US)

( * ) Notice: Subject to any disclaimer, the term of this patent is extended or adjusted under 35 U.S.C. 154(b) by 276 days.

(21) Appl. No.: 10/914,576

(22) Filed: Aug. 9, 2004

(65) Prior Publication Data

US 2006/0027522 A1    Feb. 9, 2006

(51) Int. Cl.
*H01L 21/302* (2006.01)

(52) U.S. Cl. .................. 438/691; 438/692; 438/702; 438/745; 216/52; 216/99

(58) Field of Classification Search ............... 438/691, 438/702, 692, 745; 216/52, 99
See application file for complete search history.

(56) References Cited

U.S. PATENT DOCUMENTS

| 5,362,681 | A * | 11/1994 | Roberts et al. ............ 438/464 |
| 5,939,633 | A | 8/1999 | Judy |
| 6,505,511 | B1 | 1/2003 | Geen |
| 2002/0096743 | A1 | 7/2002 | Spooner |
| 2002/0115234 | A1 * | 8/2002 | Siniaguine ............... 438/107 |
| 2003/0006502 | A1 * | 1/2003 | Karpman .................. 257/711 |
| 2003/0020062 | A1 | 1/2003 | Faris ....................... 257/40 |
| 2003/0075794 | A1 | 4/2003 | Felton |
| 2004/0002215 | A1 | 1/2004 | Dewa ...................... 438/689 |
| 2004/0035461 | A1 | 2/2004 | Susko ...................... 137/209 |

FOREIGN PATENT DOCUMENTS

| EP | 0657759 | 12/2001 |
| WO | WO 98/19337 | 5/1998 |
| WO | WO 03/054927 | 7/2003 |
| WO | WO 2004/035461 | 4/2004 |

OTHER PUBLICATIONS

Authorized Officer Klaus Meierewert, *The International Search Report and the Written Opinion of the International Searching Authority*, Sep. 14, 2005, 13 pages.
North American Silicon Wafer Committee, SEMI M1-0704, Specifications for Polished Monocrystalline Silicon Wafers, pp. 1-27 & Appendices, 1978, 2001, 2004.
Bharat Bhushan (Ed.), High Volume Manufacturing and Field Stability of MEMS Products, Spring Handbook, pp. 1087-1113, 2004.

* cited by examiner

*Primary Examiner*—Binh X Tran
(74) *Attorney, Agent, or Firm*—Bromberg & Sunstein LLP

(57) ABSTRACT

A method of producing a MEMS device removes the bottom side of a device wafer after its movable structure is formed. To that end, the method provides the device wafer, which has an initial bottom side. Next, the method forms the movable structure on the device wafer, and then removes substantially the entire initial bottom side of the device wafer. Removal of the entire initial bottom side effectively forms a final bottom side.

4 Claims, 4 Drawing Sheets

METHOD OF PRODUCING A MEMS DEVICE

RELATED PATENT APPLICATIONS

This patent application is related to co-pending U.S. patent application Ser. No. 10/914,576, entitled, "MEMS DEVICE WITH NON-STANDARD PROFILE", filed on even date herewith, and owned by Analog Devices, Inc., the disclosure of which is incorporated herein, in its entirety, by reference.

FIELD OF THE INVENTION

The invention generally relates to microelectromechanical systems (MEMS) and, more particularly, the invention relates to methods of producing MEMS devices.

BACKGROUND OF THE INVENTION

Microelectromechanical systems ("MEMS," also referred to as "MEMS devices") are a specific type of integrated circuit used in a growing number of applications. For example, MEMS currently are implemented as gyroscopes to detect pitch angles of airplanes, and as accelerometers to selectively deploy air bags in automobiles. In simplified terms, such MEMS devices typically have a very fragile movable structure suspended above a substrate, and associated circuitry (on chip or off chip) that both senses movement of the suspended structure and delivers the sensed movement data to one or more external devices (e.g., an external computer). The external device processes the sensed data to calculate the property being measured (e.g., pitch angle or acceleration).

Although they are relatively small, there still is a continuing need to reduce the size of MEMS devices and other types of integrated circuits. For example, in the cell phone industry, engineers often attempt to reduce the profile of internal application specific integrated circuits (ASICs) that have circuitry only. A reduction in the ASIC profile desirably can lead to a corresponding reduction in the overall size of the cell phone. To those ends, many in that field use conventional substrate thinning processes (e.g., backgrinding processes) to thin the substrates of many types of ASICs.

Undesirably, the prior art does not appear to have a similar solution for MEMS devices. Specifically, prior art substrate thinning techniques may damage the fragile MEMS movable structure. For example, prior art backgrinding processes (commonly used for integrated circuits without structure) require that the top side of the ASIC be secured to a supporting surface so that the bottom side may be exposed for backgrinding processes. The top side of a MEMS device, however, has the fragile MEMS structure. Accordingly, the MEMS structure would be crushed if backgrinding were used to thin the substrate of a MEMS device.

SUMMARY OF THE INVENTION

In accordance with one aspect of the invention, a method of producing a MEMS device removes the bottom side of a device wafer after its movable structure is formed. To that end, the method provides the device wafer, which has an initial bottom side. Next, the method forms the movable structure on the device wafer, and then removes substantially the entire initial bottom side of the device wafer. Removal of the entire initial bottom side effectively forms a final bottom side.

The initial bottom side may be formed by a number of methods, such as by using backgrinding processes. Alternatively, a chemical may be used to chemically etch the initial bottom side. In that case, the structure is sealed from the chemical. Moreover, the movable structure may be formed on or by the top surface of the device wafer. In some embodiments, the device wafer is fixed to a protective film having a clearance hole that seals the structure. Consequently, the structure may remain protected from debris or other external objects that could adversely impact its operation.

The method also may couple a cap wafer to the device wafer, thus encapsulating the structure. In some embodiments, the method singulates the cap wafer before removing the initial bottom side. In alternative embodiments, the method singulates the cap wafer after removing the initial bottom side.

In accordance with another aspect of the invention, a method of producing a MEMS device provides a device wafer having an initial bottom side and movable structure. Next, the method removes substantially the entire initial bottom side of the device wafer to form a final bottom side. The operation of the movable structure is substantially unaffected by removal of substantially the entire initial bottom side of the device wafer.

In accordance with another aspect of the invention, a method of producing a MEMS device provides a device wafer having an initial bottom side and movable structure, and fixes the device wafer to a protective film having a clearance hole. The device wafer is fixed to the protective film in a manner that seals the movable structure within the clearance hole. After the device wafer is fixed to the protective film, the method removes substantially the entire initial bottom side of the device wafer to form a final bottom side. Among other ways, substantially the entire initial bottom side of the device may be removed by backgrinding or chemically etching processes.

After the final bottom side is formed, the film may be removed. It then may be coupled with a cap wafer to form a substantially completed MEMS device.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments, a method of producing a MEMS device thins the MEMS substrate after MEMS structure is formed. In fact, the method can be used with either capped or uncapped MEMS devices. Among other ways, the method may use a chemical etch or backgrinding processes to thin the substrate. Details of various embodiments are discussed below.

Figure 1:
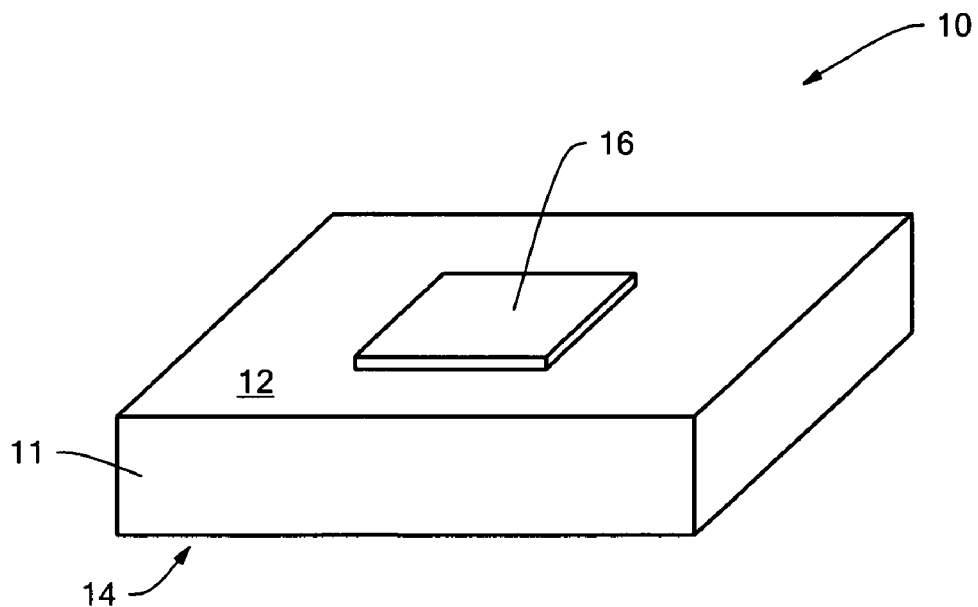
FIG. 1 schematically shows a MEMS device that may be produced in accordance with illustrative embodiments of the invention.

FIG. 1 schematically shows a generic MEMS device 10 that may be produced in accordance with illustrative embodiments of the invention. Specifically, the MEMS device 10 shown includes a device wafer 11 having movable structure (not shown herein but shown in incorporated patents, noted below) suspended over a substrate. Conventional processes may be employed to form the movable structure. For example, the structure may be formed by conventional surface micromachining ("SMM") techniques. As known by those skilled in the art, surface micromachining techniques build material layers on top of a substrate using additive and subtractive processes. In such cases, the MEMS structure may be considered to be formed slightly above or on the top surface 12 of a silicon wafer.

As a further example, the structure may be formed by etching material from the top wafer of a silicon-on-insulator wafer ("SOI wafer," not shown). In such case, the MEMS structure may be considered to be formed substantially flush with or below the top surface 12 of a silicon wafer. Of course, other types of processes may be employed to form the MEMS structure.

In illustrative embodiments, the device wafer 11 is considered to have a top surface 12 and a bottom surface 14. The top surface 12 may be considered to include a flat surface and the MEMS structure (e.g., movable mass and supporting structure), while the bottom surface 14 may be the bottom surface of the substrate. As noted above, during the MEMS production process, the bottom surface 14 (also referred to as "final bottom surface 14") is formed by thinning the original bottom surface of the device wafer 11. In other words, the bottom surface 14 of the finished MEMS device 10 schematically shown in FIG. 1 is formed by removing substantially the entire bottom surface 14 of the substrate above which the structure originally was formed. Details of the thinning process are discussed below with reference to FIGS. 2-8.

To protect the fragile MEMS structure, the MEMS device 10 also has a cap 16 secured to the device wafer 11 via a glass bonding layer. In illustrative embodiments, the cap 16 hermetically seals the structure (i.e., the cap 16 encapsulates the structure) from the environment. As further environmental protection, conventional processes also may mount the entire MEMS device 10 within a package. As noted above, however, the MEMS device 10 may omit the cap 16. In that case, the MEMS device 10 preferably is within a package that can sufficiently protect the MEMS structure from environmental contaminants, such as dust and moisture. Accordingly, discussion of a MEMS device 10 with a cap 16 is illustrative for some embodiments only.

The MEMS device 10 may include on-chip circuitry to control and/or monitor the structure. The circuitry has interconnects (not shown) to electrically communicate with an external device, such as a computer. Alternatively, the MEMS device 10 may have structure only. In such case, the structure may communicate with off-chip circuitry for the noted purposes.

Illustrative embodiments implement the MEMS device 10 as an inertial sensor, such as an accelerometer or a gyroscope. When implemented as an accelerometer, the structure includes a normally stable (movable) mass suspended above the substrate, and circuitry (not shown but noted above) for detecting mass movement. Exemplary MEMS accelerometers include those distributed and patented by Analog Devices, Inc. of Norwood, Mass. Among others, see U.S. Pat. No. 5,939,633, the disclosure of which is incorporated herein, in its entirety, by reference.

When implemented as a gyroscope, the MEMS device 10 has an oscillating mass suspended above the substrate, and circuitry (not shown but noted above) for actuating and detecting mass movement. Exemplary MEMS gyroscopes include those distributed and patented by Analog Devices, Inc. of Norwood, Mass. Among others, see U.S. Pat. No. 6,505,511, the disclosure of which is incorporated herein, in its entirety, by reference.

Discussion of an inertial sensor, however, is exemplary and thus, not intended to limit various embodiments of the invention. Accordingly, principles of various embodiments may apply to methods of producing other types of MEMS devices, such as piezoelectric devices.

Figure 2:
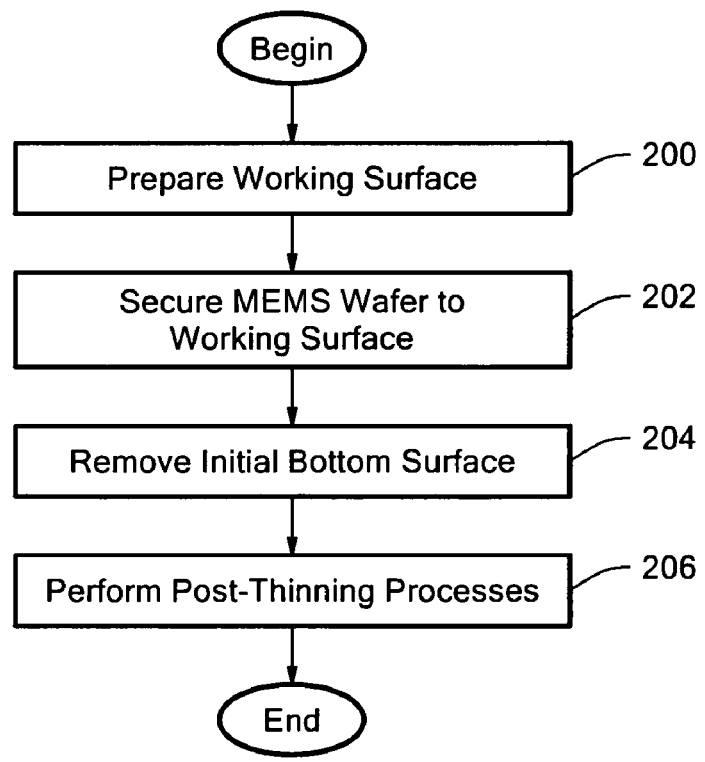
FIG. 2 shows a generic process for thinning a MEMS wafer in accordance with illustrative embodiments of the invention.

FIG. 2 schematically shows a process of thinning a device wafer 11 (also referred to as a "MEMS wafer") in accordance with one embodiment of the invention. The MEMS wafer has MEMS structure and/or circuitry produced in accordance with conventional processes. The process begins at step 200, in which a working surface 18 (see FIG. 3) is prepared to secure the MEMS wafer. More specifically, as a preliminary production step, a single silicon wafer (i.e., the MEMS wafer) often is processed to have an array of individual MEMS devices. It should be noted, however, that principles of the invention also apply MEMS wafers with a single MEMS device 10.

Illustrative embodiments thin the entire bottom surface 14 of the wafer before the wafer is singulated. Accordingly, the method prepares a surface upon which the top face of the MEMS wafer may be secured (i.e., the "working surface 18). Various embodiments use the working surface 18 shown in FIG. 3, which has a plurality of openings 20 to receive the MEMS structure. If each MEMS device 10 includes both structure and circuitry, then some embodiments may position/encapsulate only the structure through the openings 20. Alternatively, both the circuitry and structure may be encapsulated within the openings 20.

Figure 4:
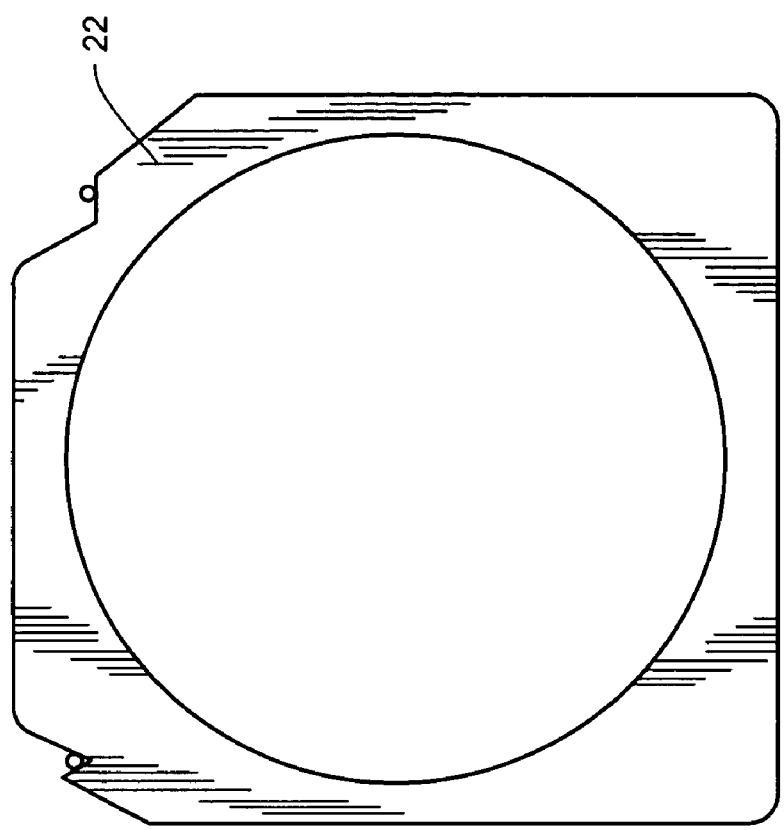
FIG. 4 schematically shows a plan view of a film frame that may be used by illustrative embodiments of the invention to in part form the working surface shown in FIG. 3.
Figure 5:
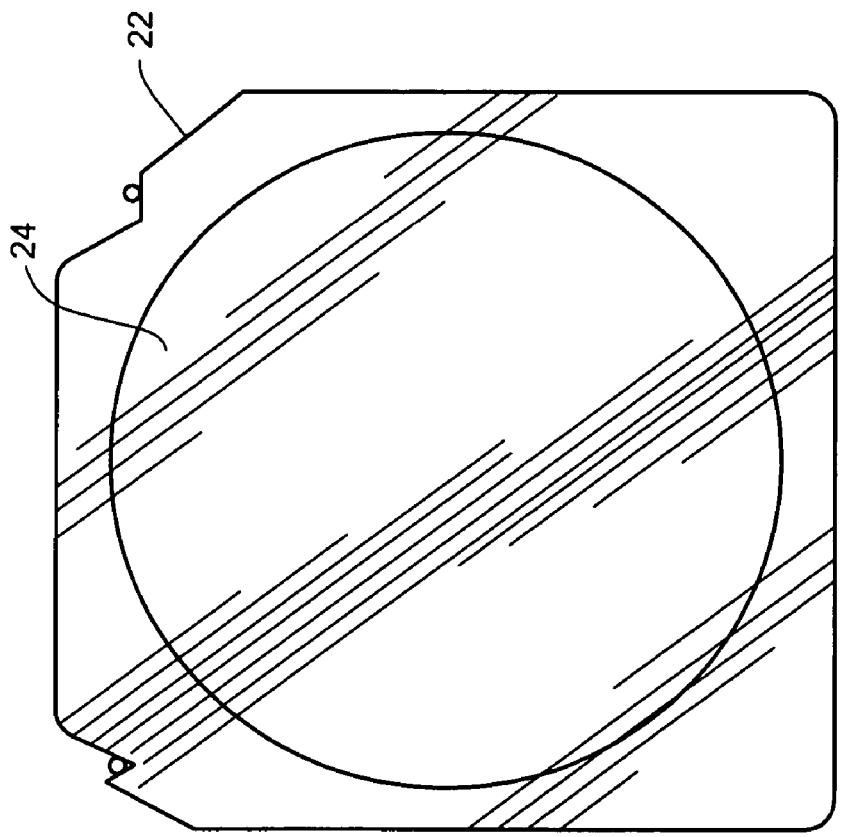
FIG. 5 schematically shows a plan view of the film frame of FIG. 4 having a layer of film for securing a MEMS device.

FIG. 4 is a plan view of an exemplary film frame 22 that may be used to produce the working surface 18. The frame 22 may be constructed from thin metal or plastic to define a generally circular opening having a perimeter. A thin plastic film 24 subsequently is mounted to the frame 22 as illustrated in FIG. 5. As discussed below, the film 24 acts as a carrier for the MEMS wafer throughout the discussed MEMS production/thinning processes discussed below. Among other things, the film 24 may be a "Mylar" film having a thickness of approximately 5 mils. In illustrative embodiments, the film 24 is coated with an adhesive on one side, thus enabling the film 24 to adhere to the surface of the film frame 22 and to the MEMS wafer.

To add the film 24, the film frame 22 may be placed on a pallet in a film carrier station. The film carrier station has a roller of film 24 positioned in a manner that permits the film 24 to be easily rolled onto the film frame 22. Accordingly, the film 24 is rolled off the roller and placed flat onto surface of the film frame 22. A rubber rolling pin may be used to apply pressure to the film 24, thus forcing it to make good contact and adhere to the film frame surface. A knife can then cut around the perimeter of film frame 22 to remove excess film 24. The film frame 22 with the film 24 is considered to be a "film frame assembly 26."

Figure 3:
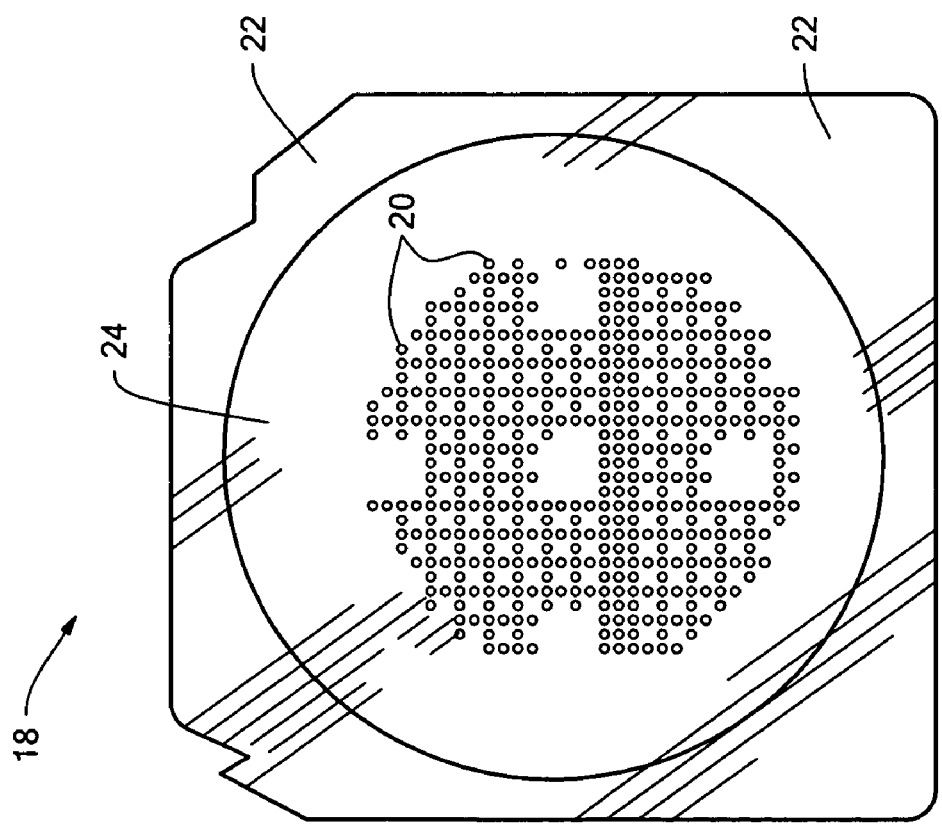
FIG. 3 schematically shows a plan view of a working surface that may secure a wafer having MEMS devices during thinning processes.

After it is formed, the film frame assembly 26 may be transported to a hole punch station where it is placed on a pallet having an opening generally corresponding to the opening in the film frame 22. The punching station comprises a punch assembly for punching holes/openings 20 in the film 24 as shown in FIG. 3. The punching station is programmed to punch holes/openings 20 in the film 24 in a programmable predetermined pattern corresponding to the relative positions of the microstructures on the wafer. The punch is selected to punch holes/openings 20 sized slightly larger than the individual microstructures.

After the working surface 18 is prepared, the method continues to step 202, in which the MEMS wafer (i.e., having pre-formed MEMS structure) is secured to the working surface 18. At this step, it is important to align the wafer with the holes/openings 20 so that the holes/openings 20 match up with the microstructures. To those ends, the film frame assembly 26 is returned to the film carrier station and a second layer of film 28 (see FIG. 7), preferably a 3 mil thick "Mylar" film, is adhered to the first layer of film. The second layer of film has no openings 20 and, therefore, seals one end of the openings 20. Alternately, the second layer of film can be added after the wafer is mounted to the film frame assembly 26.

The MEMS wafer then is fixed to the opposite side of the first layer of film (i.e., the side where the openings 20 are still exposed). In some instances, the MEMS structure of each MEMS device 10 on the wafer may protrude from the top surface 12 of the MEMS wafer and thus, extend into the openings 20. In other embodiments, the MEMS structure may be substantially flush with or below the top surface 12 of the MEMS wafer.

More specifically, to execute this step, the MEMS wafer may be placed on a chuck in a precision aligning and mounting station with the side having the MEMS structure facing upwardly. A pair of cameras positioned above the chuck obtains images of different areas of the wafer placed on the chuck. The images are transferred to a pair of video screens or a split screen on a single monitor. An operator observes the video images and aligns the wafer in the desired position. For instance, the video monitor may have cross hairs that can be used for alignment purposes. The film frame assembly 26 then is inserted in a slot above the chuck with one surface of the film frame assembly 26 facing downwardly. This mounting causes the side of the first layer of film where the openings 20 are still exposed to face downwardly toward the MEMS side of the MEMS wafer.

When the film frame assembly 26 is inserted into the machine, the cameras obtain images of the openings 20 in the film. The operator then observes the new images of the openings 20 and aligns them in a proper orientation with respect to the MEMS wafer. In another embodiment of the invention, however, the aligning station may be computer controlled and include pattern recognition software that automatically aligns the openings 20 in the film frame assembly 26 with the MEMS wafer.

A rolling pin illustratively is not used to adhere the film to the wafer since rolling pin action could disturb the alignment or damage the microstructure. Accordingly, in some embodiments of the invention, the aligning and mounting station is designed so that it can be sealed and evacuated to form a vacuum. The chuck containing the wafer then can be brought into contact with the film so that the film readily adheres to the MEMS wafer. In fact, in some embodiments, after evacuation and contact between the film and the MEMS wafer, the chamber may be re-pressurized to atmospheric pressure, thus exerting a compressive force between the film and wafer. Such a compressive force should ensure adequate adhesion between the MEMS side of the MEMS wafer and the film.

In illustrative embodiments, there are no excess openings 20 outside of the MEMS wafer outline. Such excess openings 20 on the wafer edge could inadvertently cause silicon slurry seep-in between the wafer and tape during thinning steps. Undesirably, such seep-in could lead to wafer cracking.

For more information relating to steps 200, 202, and various other processes discussed herein, see U.S. Pat. No. 5,362,681, assigned to Analog Devices, Inc. of Norwood, Mass., entitled, "Method For Separating Circuit Dies From a Wafer," and naming Carl M. Roberts, Lewis H. Long, and Paul A. Ruggerio as inventors. Also see US publication number U.S. 2002/0096743 A1, naming Timothy R. Spooner, Kieran P. Harney, David S. Courage, and John R. Martin as inventors, and entitled, "Method and Device for Protecting Micro Electromechanical Systems Structures During Dicing of a Wafer." The disclosures of the noted patent and patent publication are incorporated herein, in their entireties, by reference.

After the MEMS wafer is secured to the working surface 18, the process continues to step 204, in which its initial bottom surface is substantially entirely removed to produce a final, substantially planar, bottom surface 14. As a result of this step, the overall profile of the MEMS wafer is thinner. To that end, at this point in the process, the top surface 12 of the MEMS wafer is fixedly secured to the working surface 18. Standard processes then may be applied to the bottom surface of the MEMS wafer to produce the final bottom surface 14. In some embodiments, mechanical thinning may be applied with a conventional backgrinding device, such as a diamond grinding wheel.

In other embodiments, the initial bottom surface may be chemically removed by conventional techniques, such as chemical etching processes. Exemplary chemicals that may be used in this process include potassium hydroxide or tetra methyl ammonium hydroxide.

When using such surface removal processes (i.e., either or both mechanical and chemical processes), it is important to ensure that the MEMS structure is sufficiently sealed within the openings 20 in the film frame assembly 26. Such a seal should prevent debris from damaging the fragile MEMS structure on the MEMS wafer. Accordingly, the seal should prevent silicon dust penetration (e.g., when using a mechanical thinning process), chemical penetration (e.g., when using the chemical processes) or both. Of course, as noted above, mounting the MEMS structure within the openings 20 also ensures that the fragile MEMS structure does not become crushed during the thinning processes.

After the initial bottom surface is removed, the process may continue to step 206, in which post-thinning processes may be performed. Among others, such post-thinning processes may include polishing the final bottom surface 14 to remove surface imperfections, and dicing the wafer to produce a plurality of individual MEMS devices. In addition, a saw tape may be adhered to the final bottom surface 14 to further protect the wafer/individual MEMS devices when handled during subsequent steps. The film 24 and assembly 26 also may be removed by conventional processes. For example, a tape or clip may be used to peel off the layers of film. It should be noted that the order of these post-thinning steps can vary. Each resulting MEMS device 10 can then be mounted in a package assembly, on a board, or in some other conventional manner.

Figure 6:
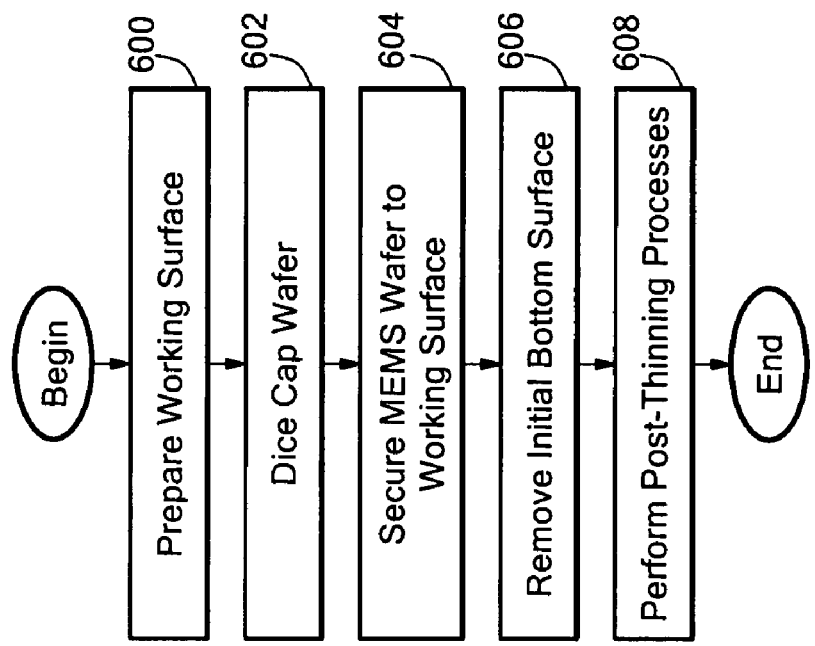
FIG. 6 shows a more specific process for thinning a MEMS wafer having a diced cap wafer.

Various embodiments noted above thin the MEMS wafer before capping because, among other reasons, it may reduce bond-line stresses arising from wafer bow. Notwithstanding this consideration, other embodiments may thin the MEMS wafer after a cap wafer is secured to the MEMS wafer. FIG. 6 schematically shows one process for thinning a MEMS wafer coupled with a cap wafer. Among other benefits, the cap 16 may further protect the MEMS structure during a thinning step from chemicals and/or silicon debris.

FIG. 6 shows a first exemplary process of thinning/producing a capped MEMS wafer in accordance with illustrative embodiments of the invention. The process begins at step 600, in which the working surface 18 is prepared. The working surface 18 illustratively is prepared in substantially the same manner as discussed above with regard to step 200 of FIG. 2. Before, during, or after step 200, the cap wafer may be diced (after it is secured to the MEMS wafer) in accordance with conventional processes (step 202). This dicing step, however, does not dice the underlying MEMS wafer—it dices the cap wafer only. As a result, the cap wafer effectively forms a plurality of individual caps 16 on the MEMS wafer. For more information relating to capping, see U.S. patent publication No. 2003/0075794A1, the disclosure of which is incorporated herein, in its entirety, by reference.

Figure 7:
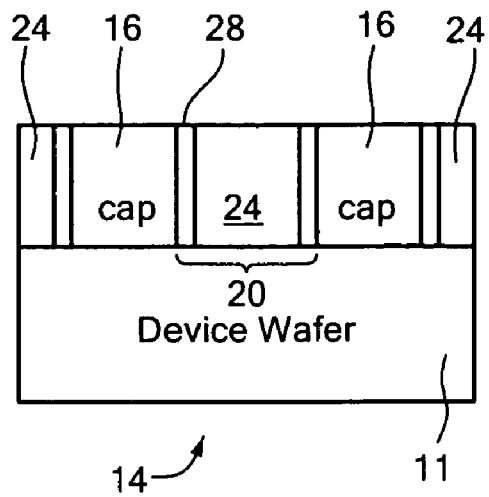
FIG. 7 schematically shows a cross-sectional view of a MEMS wafer with a diced cap wafer on a frame with pierced film as shown in FIG. 5.

The MEMS wafer then is secured to the working surface 18 in a similar manner as discussed above with regard to step 202 of FIG. 2 (step 604). To that end, as shown in FIG. 7, the caps 16 each fit within one opening 20 of the film frame assembly 26. More specifically, FIG. 7 schematically shows a cross-sectional view of the MEMS wafer after it is secured to the working surface 18. As shown, the caps 16 fit within openings 20 formed by the pierced film. The top film 28 and pierced film 24 together seal the cap 16 to protect it and its underlying MEMS structure from debris. In a manner similar to other embodiments, if the MEMS wafer includes both structure and circuitry, then the circuitry may be within the openings 20 or beneath the film. In either case, the circuitry should be protected from environmental debris.

The process concludes in the same way as noted above with regard to the process in FIG. 2 by removing the initial bottom surface (step 606) and performing post-thinning processes (step 608). Accordingly, the noted post-thinning processes may be conducted to complete the MEMS production process.

The inventors directed a test of the process of FIG. 6. To that end, the semi-auto mode of the Okamoto GNX-200 backgrinder was used to grind the MEMS wafer to a desired thickness. Two six-inch wafers were prepared for backgrinding to 13 and 19 mils, respectively. For this process, the initial and final thickness for a six-inch wafer was adjusted. Specifically, the standard thickness using such a wafer is about 33 mils (i.e., 28 mils plus 5 mils tape/film). This was modified to 48 mils (28 mils plus 15 mils for the cap 16 plus 5 mils for the film) to accommodate the capped wafers. The wafers were successfully background to the desired final thickness.

Figure 8:
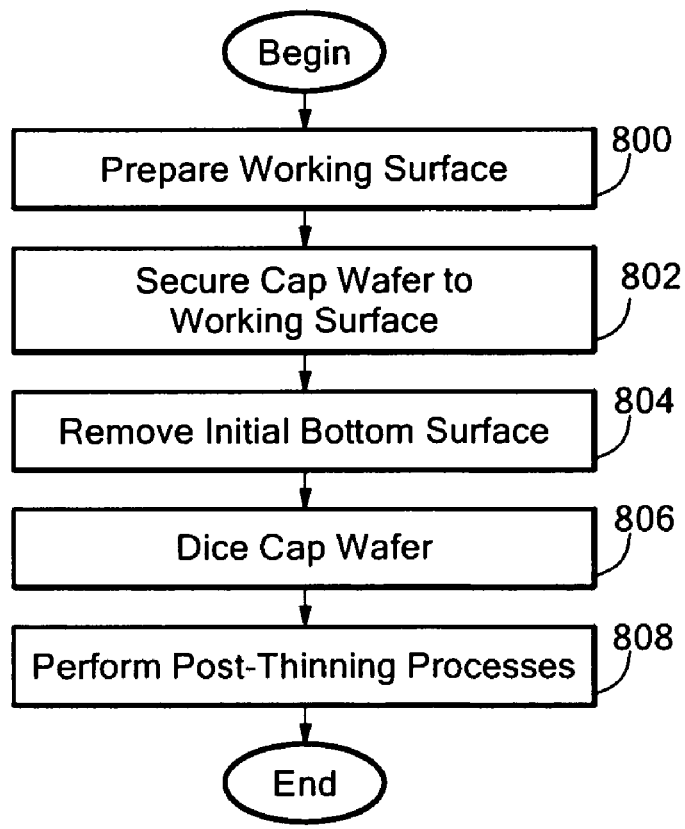
FIG. 8 shows a more specific process for thinning a MEMS wafer having an undiced cap wafer.

FIG. 8 shows another process for thinning a capped wafer in accordance with illustrative embodiments. The process begins at step 800, in which the working surface 18 is prepared in a similar manner as discussed above. In this case, however, there is no need to pierce the film to form the openings 20. Next, the cap wafer is secured to the working surface 18 (step 802) and the initial bottom surface of the MEMS wafer is removed in a manner similar to the methods discussed above (step 804). After the MEMS wafer is thinned, the cap wafer is diced in a conventional manner (step 806). This involves removing the cap wafer from its contact with the working surface 18 and positioning the MEMS wafer on a saw device capable of performing singulating processes. Post-thinning processes then may be performed (step 808), thus completing the process.

Accordingly, as noted above, contrary to conventional knowledge, a MEMS wafer having pre-formed MEMS structure can be thinned to comply with the continuing need to reduce MEMS sizes. Such illustrative processes adequately protect the fragile underlying MEMS structure, thus facilitating the overall process.

Although the above discussion discloses various exemplary embodiments of the invention, it should be apparent that those skilled in the art can make various modifications that will achieve some of the advantages of the invention without departing from the true scope of the invention.

What is claimed is:

1. A method of producing a MEMS device comprising:
providing an uncapped device wafer having an initial bottom side, a top side and a movable structure;
removing substantially the entire initial bottom side of the uncapped device wafer to form a final bottom side;
coupling a cap wafer to the device wafer, the cap wafer encapsulating the movable structure;
singulating the cap wafer to form individual caps on the device wafer; and
dicing the device wafer into individual MEMS devices.

2. The method as defined by claim 1 wherein removing includes backgrinding the initial bottom side.

3. The method as defined by claim 1 wherein removing includes fixing the device wafer to a protective film having a clearance hole, the structure being sealed within the clearance hole.

4. The method as defined by claim 3 wherein removing includes using a chemical to chemically etch the initial bottom side, the structure being sealed from the chemical.

* * * * *